United States Patent
Corneille et al.

(10) Patent No.: US 9,935,225 B2
(45) Date of Patent: Apr. 3, 2018

(54) ELECTRICAL CONNECTORS OF BUILDING INTEGRABLE PHOTOVOLTAIC MODULES

(71) Applicant: Apollo Precision (Kunming) Yuanhong Limited, Kunming, Yunan (CN)

(72) Inventors: Jason S. Corneille, San Jose, CA (US);
Michael Meyers, San Jose, CA (US);
Adam C. Sherman, Newark, CA (US);
Nazir Ahmad, San Jose, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 253 days.

(21) Appl. No.: 14/806,537

(22) Filed: Jul. 22, 2015

(65) Prior Publication Data

US 2016/0027944 A1 Jan. 28, 2016

Related U.S. Application Data

(63) Continuation of application No. 13/046,461, filed on Mar. 11, 2011, now Pat. No. 9,112,080.

(51) Int. Cl.
*H01L 31/0465* (2014.01)
*H01L 31/05* (2014.01)
(Continued)

(52) U.S. Cl.
CPC .... *H01L 31/0504* (2013.01); *H01L 31/02013* (2013.01); *H01L 31/0465* (2014.12);
(Continued)

(58) Field of Classification Search
CPC ................ H01L 31/02; H01L 31/0201; H01L 31/02008; H01L 31/02013; H01L 31/0256;
(Continued)

(56) References Cited

U.S. PATENT DOCUMENTS 3,291,636 A 12/1966 Reighter et al.
3,325,769 A 6/1967 Travis
(Continued)

FOREIGN PATENT DOCUMENTS

EP 2429002 3/2012
WO 2009/137347 11/2009
(Continued)

OTHER PUBLICATIONS

U.S. Appl. No. 13/046,453, filed Mar. 11, 2011, entitled "Separable Flexible Photovoltaic Connector" by Adam C. Sherman et al.
(Continued)

*Primary Examiner* — Susan D Leong
(74) *Attorney, Agent, or Firm* — Weaver Austin Villeneuve & Sampson LLP

(57) ABSTRACT

Provided are novel building integrable photovoltaic (BIP) modules and methods of fabricating thereof. A module may be fabricated from an insert having one or more photovoltaic cells by electrically interconnecting and mechanically integrating one or more connectors with the insert. Each connector may have one or more conductive elements, such as metal sockets and/or pins. At least two of all conductive elements are electrically connected to the photovoltaic cells using, for example, bus bars. These and other electrical components are electrically insulated using a temperature resistant material having a Relative Temperature Index (RTI) of at least about 115° C. The insulation may be provided before or during module fabrication by, for example, providing a prefabricated insulating housing and/or injection molding the temperature resistant material. The temperature resistant material and/or other materials may be used for mechanical integration of the one or more connectors with the insert.

8 Claims, 10 Drawing Sheets

(51) Int. Cl.

| | | |
|---|---|---|
| *H01L 31/048* | (2014.01) | |
| *H01L 31/052* | (2014.01) | |
| *H01L 31/18* | (2006.01) | |
| *H01L 31/02* | (2006.01) | |
| *H02S 20/23* | (2014.01) | |
| *H02S 20/25* | (2014.01) | |
| *H02S 40/36* | (2014.01) | |
| *H02S 40/42* | (2014.01) | |

(52) U.S. Cl.
CPC .......... *H01L 31/0481* (2013.01); *H01L 31/05* (2013.01); *H01L 31/052* (2013.01); *H01L 31/18* (2013.01); *H01L 31/186* (2013.01); *H02S 20/23* (2014.12); *H02S 20/25* (2014.12); *H02S 40/36* (2014.12); *H02S 40/42* (2014.12); *Y02B 10/12* (2013.01); *Y02E 10/50* (2013.01)

(58) Field of Classification Search
CPC ............... H01L 31/042; H01L 31/0422; H01L 31/0465; H01L 31/0481; H01L 31/05; H01L 31/0504; H01L 31/0512; H01L 31/052; H01L 31/0725; H01L 31/18; H01L 31/186
See application file for complete search history.

(56) References Cited

U.S. PATENT DOCUMENTS

| | | |
|---|---|---|
| 3,838,234 A | 9/1974 | Peterson |
| 4,754,285 A | 6/1988 | Robitaille |
| 4,847,818 A | 7/1989 | Olsen |
| 5,059,254 A | 10/1991 | Yaba et al. |
| 5,179,733 A | 1/1993 | Matsui |
| 5,209,987 A | 5/1993 | Penneck |
| 5,218,577 A | 6/1993 | Seager |
| 5,232,518 A | 8/1993 | Nath et al. |
| 5,391,235 A | 2/1995 | Inoue |
| 5,526,006 A | 6/1996 | Akahane et al. |
| 6,111,189 A | 8/2000 | Garvison et al. |
| 6,456,724 B1 | 9/2002 | Watanabe |
| 6,534,768 B1 | 3/2003 | Ciurczak et al. |
| 6,576,830 B2 | 6/2003 | Nagao et al. |
| 6,707,689 B2 | 3/2004 | Momota et al. |
| 6,840,799 B2 | 1/2005 | Yoshikawa et al. |
| 6,967,278 B2 | 11/2005 | Hatsukaiwa et al. |
| 7,056,145 B2 | 6/2006 | Campbell, III et al. |
| 7,138,578 B2 | 11/2006 | Komamine |
| 7,297,867 B2 | 11/2007 | Nomura et al. |
| 7,387,537 B1 | 6/2008 | Daily et al. |
| 7,708,578 B1 | 5/2010 | Lenox |
| 7,713,089 B2 | 5/2010 | Faust et al. |
| 7,726,301 B2 | 6/2010 | Shin et al. |
| 7,762,832 B2 | 7/2010 | Minnick |
| 7,789,700 B2 | 9/2010 | Wang et al. |
| 7,824,191 B1 | 11/2010 | Browder |
| 7,854,095 B2 | 12/2010 | Banister |
| 7,963,802 B2 | 6/2011 | Corneille et al. |
| 7,987,641 B2 | 8/2011 | Cinnamon |
| 8,147,274 B2 | 4/2012 | Mizukami |
| 8,192,207 B2 | 6/2012 | Iida |
| 8,286,393 B2 | 10/2012 | Reyal et al. |
| 8,333,040 B2 | 12/2012 | Shioa et al. |
| 8,414,308 B1 | 4/2013 | Meyers |
| 8,613,169 B2 | 12/2013 | Sherman et al. |
| 8,656,657 B2 | 2/2014 | Livsey et al. |
| 8,695,289 B2 | 4/2014 | Koch et al. |
| 8,813,460 B2 | 8/2014 | Cinnamon et al. |
| 9,112,080 B1 | 8/2015 | Corneille et al. |
| 9,231,123 B1 | 1/2016 | Sherman |
| 9,577,133 B2 | 2/2017 | Sherman |
| 2003/0098059 A1 | 5/2003 | Hanoka |
| 2003/0227663 A1 | 12/2003 | Agrawak et al. |
| 2005/0000562 A1 | 1/2005 | Kataoka et al. |
| 2006/0054213 A1 | 3/2006 | Baret et al. |
| 2008/0053511 A1 | 3/2008 | Nakamura |
| 2008/0149170 A1 | 6/2008 | Hanoka |
| 2008/0160804 A1 | 7/2008 | Daily et al. |
| 2008/0196756 A1 | 8/2008 | Basol |
| 2008/0289681 A1 | 11/2008 | Adriani et al. |
| 2008/0314432 A1 | 12/2008 | Paulson et al. |
| 2009/0078299 A1 | 3/2009 | Cinnamon et al. |
| 2009/0084432 A1 | 4/2009 | Kosmehl |
| 2009/0126782 A1 | 5/2009 | Krause et al. |
| 2009/0145746 A1 | 6/2009 | Hollars |
| 2009/0215304 A1 | 8/2009 | Faust et al. |
| 2010/0146878 A1 | 6/2010 | Koch et al. |
| 2010/0326498 A1 | 12/2010 | Corneille et al. |
| 2011/0048507 A1 | 3/2011 | Livsey et al. |
| 2011/0139288 A1 | 6/2011 | Rushlander et al. |
| 2011/0183540 A1 | 7/2011 | Keenihan et al. |
| 2011/0220180 A1 | 9/2011 | Cinnamon et al. |
| 2011/0277811 A1 | 11/2011 | Corneille et al. |
| 2013/0118558 A1 | 5/2013 | Sherman |

FOREIGN PATENT DOCUMENTS

| | | |
|---|---|---|
| WO | 2009/137348 | 11/2009 |
| WO | 2009/137351 | 11/2009 |
| WO | 2009/137352 | 11/2009 |
| WO | 2009/137353 | 11/2009 |

OTHER PUBLICATIONS

U.S. Appl. No. 13/042,320, filed Mar. 7, 2011, entitled "Sliding Electrical Connectors for Building Integrable Photovoltaic Modules" by Michael C. Meyers.
U.S. Appl. No. 13/043,227, filed Mar. 8, 2011, entitled "Flexible Connectors for Building Integrable Photovoltaic Modules" by Adam C. Sherman.
U.S. Appl. No. 13/046,453, Office Action dated Jan. 9, 2012.
U.S. Appl. No. 13/046,453, Final Office Action dated May 18, 2012.
U.S. Appl. No. 13/042,320, Office Action dated Jul. 26, 2012.
U.S. Appl. No. 13/042,317, Notice of Allowance dated Dec. 7, 2012.
U.S. Appl. No. 13/046,461, Office Action dated Apr. 9, 2013.
U.S. Appl. No. 13/046,461, Final Office Action dated Oct. 8, 2013.
U.S. Appl. No. 13/046,461, Office Action dated Sep. 19, 2013.
U.S. Appl. No. 13/046,461, Final Office Action dated Jul. 10, 2014.
U.S. Appl. No. 13/046,461, Office Action dated Sep. 3, 2014.
U.S. Appl. No. 13/046,461, Notice of Allowance dated Apr. 13, 2015.
U.S. Appl. No. 13/046,461, Notice of Allowance dated Aug. 26, 2015.
U.S. Appl. No. 13/298,178, Office Action dated Feb. 20, 2015.
U.S. Appl. No. 13/345,040, Notice of Allowance dated Apr. 24, 2013.
U.S. Appl. No. 13/298,178, Office Action dated May 23, 2014.
U.S. Appl. No. 13/298,178, Office Action dated Dec. 22, 2015.
U.S. Appl. No. 13/298,178, Office Action dated Oct. 4, 2016.

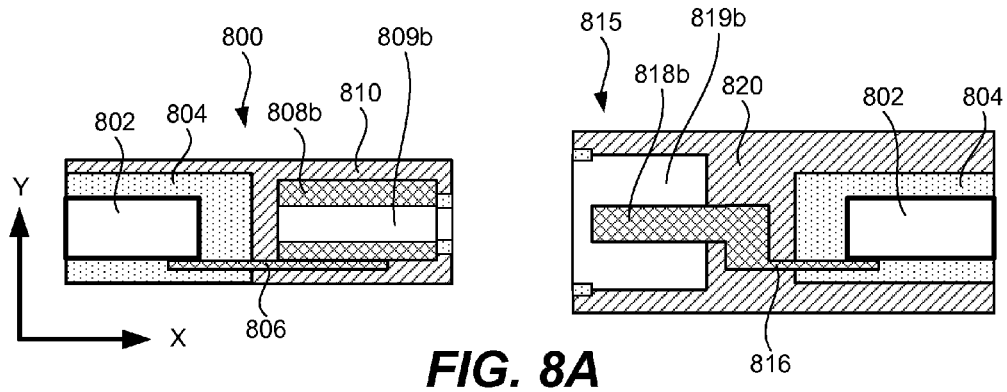
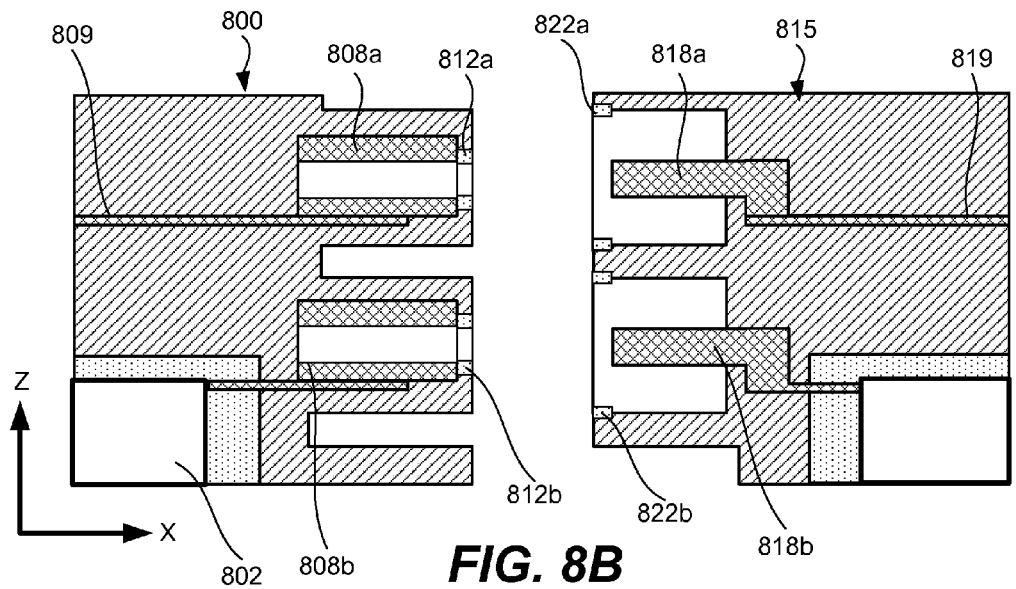
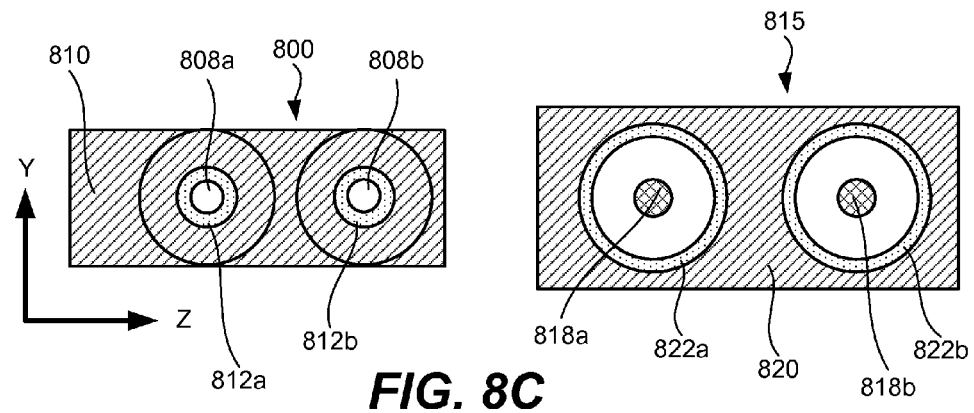

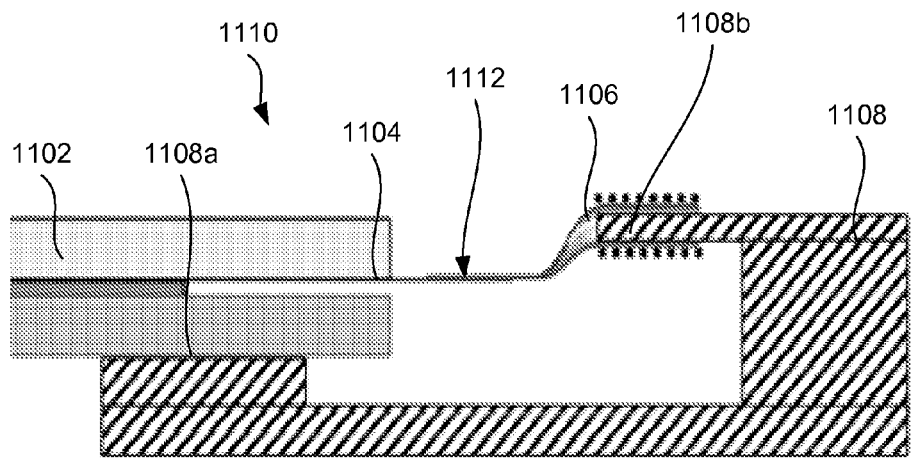
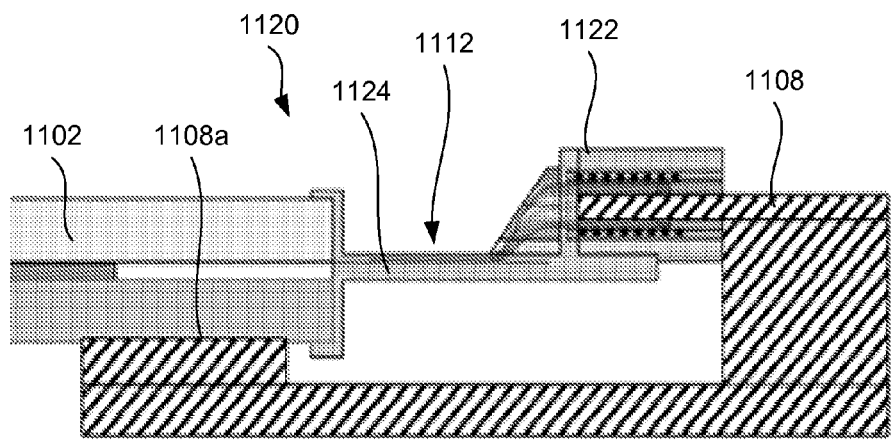
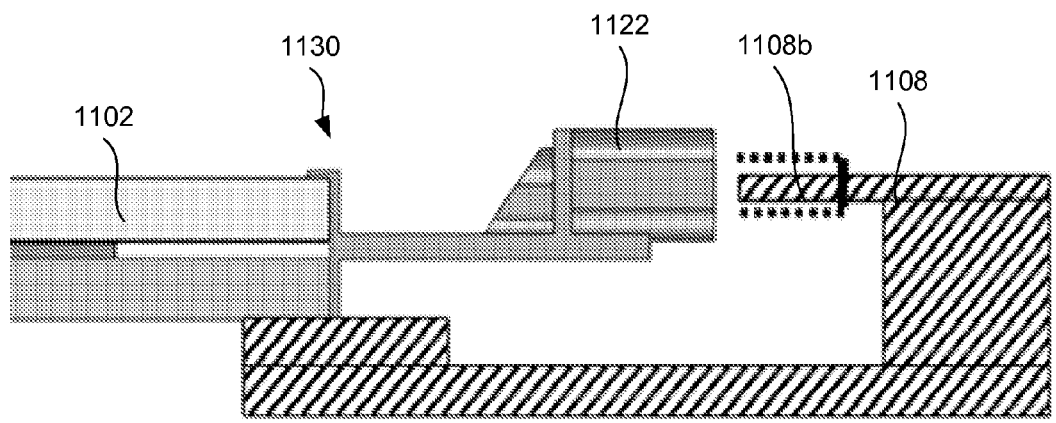
*FIG. 11*

ELECTRICAL CONNECTORS OF BUILDING INTEGRABLE PHOTOVOLTAIC MODULES

CROSS-REFERENCE TO RELATED APPLICATION

This application is a continuation of and claims priority to U.S. patent application Ser. No. 13/046,461, titled "ELECTRICAL CONNECTORS OF BUILDING INTEGRABLE PHOTOVOLTAIC MODULES," filed Mar. 11, 2011, all of which is incorporated herein by reference for all purposes.

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules and methods of fabricating thereof. A module may be fabricated from an insert having one or more photovoltaic cells by electrically interconnecting and mechanically integrating one or more connectors with the insert. Each connector has one or more conductive elements, such as metal sockets and/or pins. At least two conductive elements are electrically connected to the photovoltaic cells using, for example, bus bars. These and other electrical components are electrically insulated using a temperature resistant material having a Relative Temperature Index (RTI) of at least about 115° C. or, at least in some cases at least about 120° C., 125° C. 130° C., 135° C. or more. The RTI is the maximum service temperature at which the critical properties of a material will remain within acceptable limits over a long period of time. The applicable standard is UL 746B, incorporated herein by reference. The insulation may be provided before or during module fabrication by, for example, providing a prefabricated insulating housing and/or injection molding the temperature resistant material. The temperature resistant material and/or other materials may be used for mechanical integration of the one or more connectors with the insert.

In certain embodiments, a method of fabricating a BIP module involves providing a photovoltaic module insert having one or more electrically interconnected photovoltaic cells and one or more bus bars extending away from at least one side of the insert. Two of the bus bars are electrically connected to the photovoltaic cells. A connector member having one or more conductive elements is also provided. The method continues with electrically connecting at least one conductive element to at least one bus bar. The method continues with forming a connector body around at least a portion of the connector member by injection molding a polymeric material, which may be a temperature resistant material and/or other some other material. In either case, the resulting BIP module includes a temperature resistant material that has an RTI of at least about 115° C., which covers at least the conductive element and the bus bar.

In certain embodiments, a temperature resistant material includes one or more of rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives. One or more of these additives may be also a part of other non-temperature resistant materials used in forming a connector body or an overmold covering at least a portion of the connector body. In more specific embodiments, the material has an RTI of at least about 125° C. or even an RTI of at least about 135° C.

In certain embodiments, a temperature resistant material may be at least partially enclosed in one or more of flexible materials. Some examples of flexible materials include polyethylene, polypropylene, thermoplastic olefins, thermoplastic rubber, thermoplastic elastomer, ethylene propylene diene, monomer (EPDM), fluoroelastomers or thermoplastic vulcanizates (TPV), and flexible cast thermoset materials, such as urethanes or silicones. In general, various flexible thermoplastic elastomers that have suitable thermally durable behavior may be used. Some specific examples include SANTOPRENE® (Supplied by Exxon Mobil in Houston, Tex.), HIPEX® (Supplied by Sivaco in Santa Clara, Calif.), EFLEX® (Supplied by E-Polymers Co., Ltd. In Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), Elastron® (Supplied by Elastron Minya in Kocaeli, Turkey). Some additional examples include nitrile butadiene rubber (e.g., KRYNAC® (available from Lanxess in Maharashtra, India), NIPOL® (available from Zeon Chemicals in Louisville, Ky.) or NYSYN® (available from Copolymer Rubber & Chemicals in Baton Rouge, La.)), hydrogenated nitrile butadiene rubber (e.g., THERBAN® (available from Lanxess in Maharashtra, India), ZETPOL® (available from Zeon Chemicals in Louisville, Ky.)), and tetra-fluoro-ethylene-propylene (e.g., AFLAS® (Asahi Glass in Tokyo, Japan) and DYNEON BRF® (available from 3M in St. Paul, Minn.) and VITON VTR® (available from DuPont Performance Polymers in Wilmington, Del.)).

Some materials described above and elsewhere in this document may include engineered polymers, which are specifically formulated to meet certain requirements specific for photovoltaic applications. For example, certain hybrid block co-polymers may be used.

In more specific embodiments, a provided connector member includes a prefabricated insulating housing that at least initially mechanically supports and/or electrically insulates one or more conductive elements. The housing may be made from or include one or more temperature resistant materials described above. In even more specific embodiments, a connector body is formed around the insulating housing by injection molding one or more of the flexible materials described above. Other more specific examples are listed above. This connector body extends over at least a portion of the photovoltaic module insert to provide mechanical support to the connector with respect to the insert. In certain embodiments, a housing includes one or more extension flaps forming an insulating sleeve around one or more bus bars extending outside the insert and connected to the one or more conductive elements inside the insulating housing. In other embodiments, a fabrication process involves insulating such portions of the bus bars and/or other electrical components prior to forming the rest of the connector body. This insulation component may be formed by injection molding one or more temperature resistant materials.

In certain embodiments, a connector body is formed using a temperature resistant material without any additional materials molded over the connector body. The connector body may extend over at least a portion of the insert to support the connector body with respect to the insert. In other embodiments, fabrication of a module involves forming an additional module overmold over at least a portion of the connector body made from the temperature resistance material. The module overmold extends over at least a portion of the insert. In certain specific embodiments, both the overmold and the connector body extend over the insert. The overmold may be made from one or more of the flexible materials listed above.

In certain embodiments, a connector body includes a cavity with a conductive element positioned inside the cavity, e.g., forming a conductive socket inside the cavity for receiving a conductive pin of another connector. The connector body may also include a seal positioned around the cavity's opening. The seal may be formed by injection molding of one or more of the flexible materials listed above. Other more specific examples are listed above. When two connectors engage with each other, one or two seals (e.g., one seal on each connector) protect the conductive elements of the two connectors from contaminations. In some embodiments, electrically connecting a conductive element of a connector member to a bus bar of the insert involves aligning the connector member with respect to the insert. More specifically, the conductive element is aligned with respect to the bus bar. This alignment may be substantially maintained during one or more later operations, for example, during formation of a connector body. Electrically connecting the conductive element to the bus bar may involve one or more of the following techniques: resistance welding, ultrasonic welding, laser welding, and soldering.

Also provided are examples of BIP modules for use on building structures, such as rooftops. In certain embodiments, a BIP module includes an insert having one or more electrically interconnected photovoltaic cells and one or more bus bars extending away from the insert. Two of these bus bars are electrically connected to the cells. The BIP module also includes one or more connectors including conductive elements. At least two of these conductive elements electrically connected to the cells using two or more of the bus bars. One of the connectors may have a connector body formed around its one or more conductive elements and portions of the bus bars extending from the inserts and making electrical connections to the conductive elements. The connector body may be made from a temperature resistant material having an RTI of at least about 115° C. or, more particularly, an RTI of at least about 125° C.

In certain embodiments, a portion of a connector body or an overmold over a connector body may be made from one or more of flexible materials listed above. Other more specific examples are listed above. In general, these materials may be formed around a portion of the connector body made from one or more of the temperature resistant materials or a prefabricated connector described above. An insert of the BIP module may have one or more ventilation channels for cooling the module during its operation. In certain embodiments, an insert has a bus bar that is not electrically connected to the photovoltaic cells. This bus bar may extend from one side of the module to another and be used, for example, for making in-series electrical connections with other modules. This bus bar may be electrically connected to a separate conductive element of a connector. Another conductive element of the same connector may be electrically connected to the photovoltaic cells.

These and other aspects of the invention are described further below with reference to the figures.

BRIEF DESCRIPTION OF THE DRAWINGS

FIGS. 8A-8C are schematic cross-sectional views of two connectors configured for interconnection with each other in accordance with certain embodiments.

FIG. 11 illustrates a schematic illustration of an alignment fixture at different stages during the module fabrication process in accordance with certain embodiments.

DETAILED DESCRIPTION OF EXAMPLE EMBODIMENTS

Figure 1:
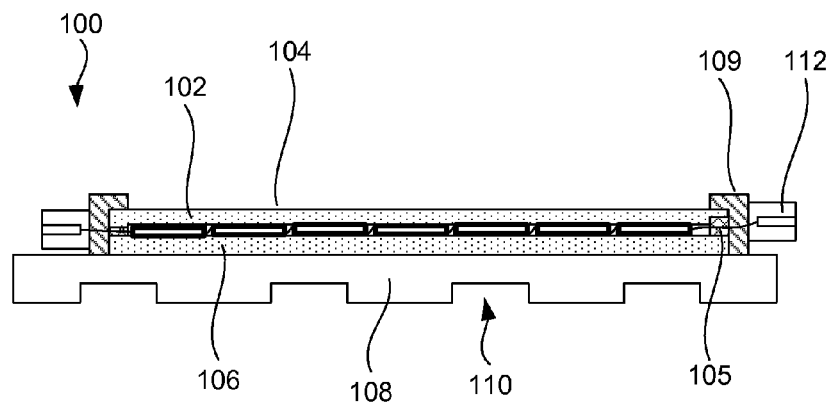
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, BIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

BIP modules described herein include designs capable of withstanding higher operating temperatures typical for rooftops and other operating environments. Electrical components of connectors and/or inserts are electrically insulated using a temperature resistant material having a Relative Temperature Index (RTI) of at least about 115° C. In certain embodiments, higher RTI rated materials are used. An RTI is defined as the maximum service temperature at which certain properties of the material remain within predetermined limits over a period of time. More specifically, an RTI may be defined as a maximum service temperature for a material where a class of critical property will not be unacceptably compromised through chemical thermal degradation. This time frame may span over the reasonable life of an electrical product, relative to a reference material. For example, a polymer with 115° C. RTI rating may preserve at least 50% of its dielectric strength, tensile impact strength, and/or tensile strength for the entire operating period of a BIP module (e.g., 15 or 20 years). Some examples of rigid materials that have such RTI ratings are presented above. However, RTI rated materials may be expensive and often do not provide all needed properties, such as mechanical support, ductility, conformality, low cost, UV stability, and other characteristics. Other materials may also be used to form an overmold to provide additional mechanical support and/or electrical insulation. In certain embodiments, polyethylene, polypropylene, and/or thermoplastic rubber is injection molded over the temperature resistant materials and at least a portion of the insert.

Furthermore, embodiments of BIP module designs provided herein are configured for rapid installation on building structures, such as building rooftops, providing substantial labor savings. In certain embodiments, mechanical alignment of two BIP modules in the same row also results in electrical interconnection of the two modules. In specific embodiments, connectors are used to align one BIP module with respect to another.

For purposes of this document, a BIP module is defined as an assembled unit ready for installation on a building structure. One particular example of a BIP module is a photovoltaic shingle for installation on roof structures. A BIP module may be configured for direct connection to other BIP modules (i.e., connected only via BIP-integrated electrical connectors) or indirect connection to other BIP modules (i.e., connection via a separate connector not integrated with a BIP module). A BIP module typically is fabricated using a photovoltaic insert that has two or more integrated electrical connectors. Other components of BIP modules may include moisture flaps (e.g., a top flap, which is sometimes referred to as a "top lap" and/or a side skirt), mechanical support sheets or components, sealing components, heat transfer features (e.g., ventilation channels in a support sheet), and the like.

A photovoltaic insert is defined as a prefabricated photovoltaic subassembly that forms part of a BIP module and used for its fabrication. The insert includes one or more photovoltaic cells, e.g., multiple electrically interconnected photovoltaic cells, sealing sheets enclosing the cell or cells, cell-cell interconnectors (if necessary), electrical contacts extending out of the sealing sheets for establishing electrical connections with the photovoltaic cells and other electrical components of the insert. In certain embodiments, the insert includes one or more bus bars, or other electrically conductive components configured to carry current through an insert or BIP module. A bus bar may be made of a strip of highly conductive material, typically metal, for example copper, that is configured to carry a rated amount of current in the context of its operating environment. An insert may include one or more bus bars that extends from one edge of the insert, to another without having any direct electrical connections to the photovoltaic cells. An insert may also include one or more bus bars that are configured for or in direct electrical communication with one or more photovoltaic cells of the insert.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (110), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-tetrafluoroethylene (ETFE), fluorinated ethylene-propylene (FEP), perfluoroalkoxy (PEA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 $g/m^2/day$. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
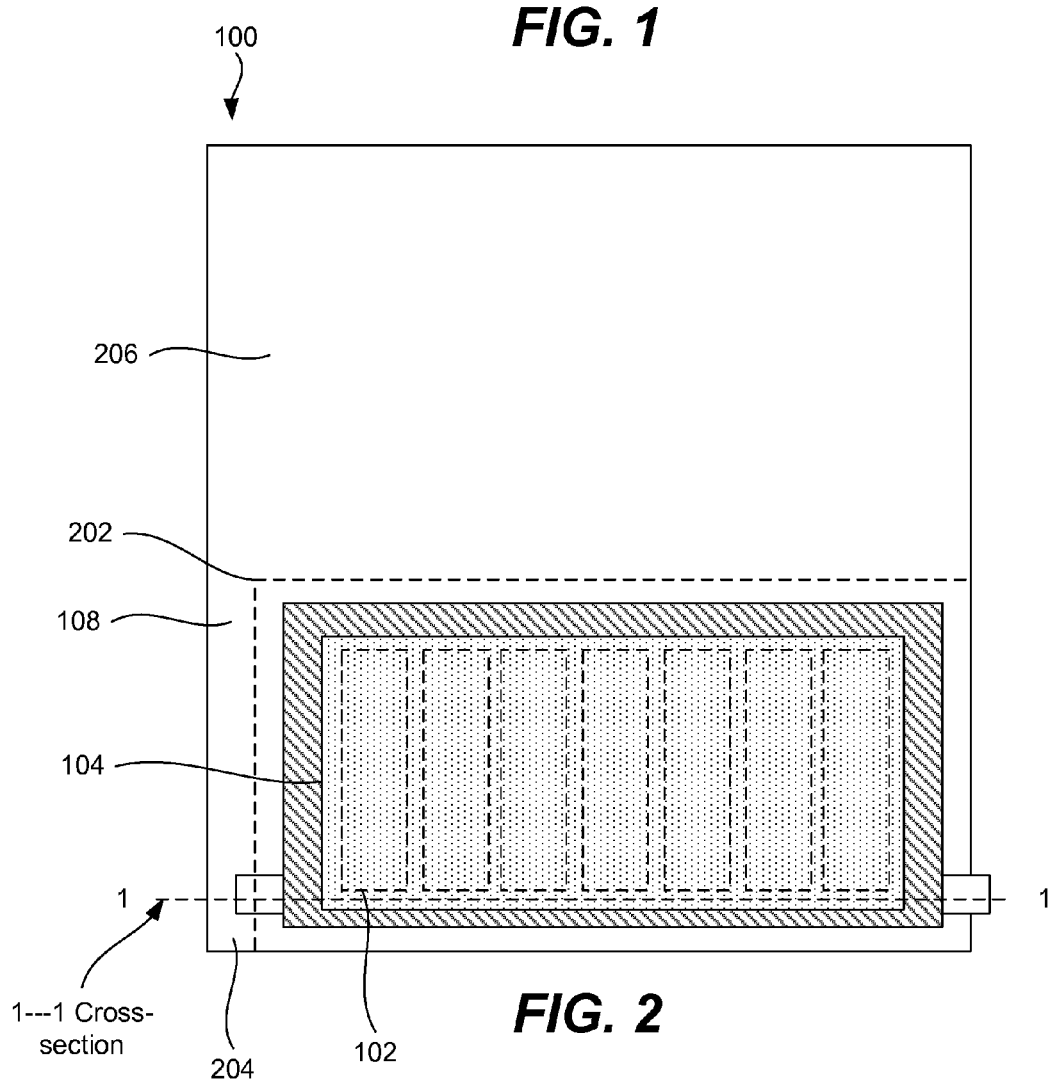
FIG. 2 is a schematic top view of a BIP module in accordance with certain embodiments.

FIG. 2 is a schematic top view of BIP module 100 in accordance with certain embodiments. Support sheet 108 is shown to have aside skirt 204 and atop flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
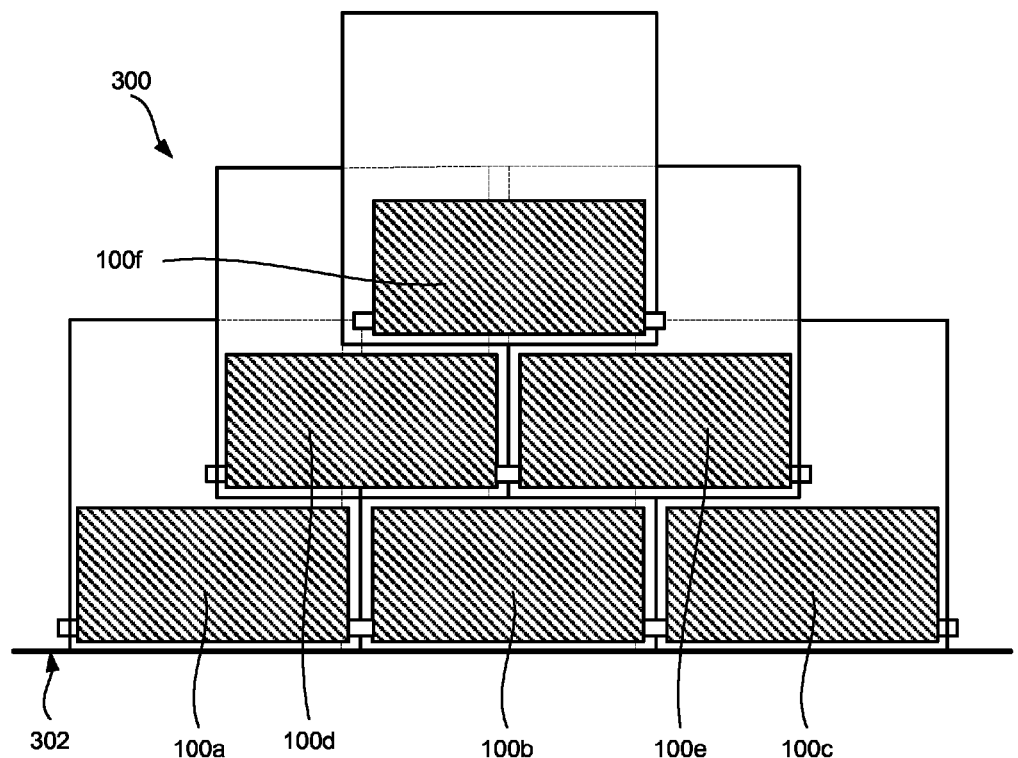
FIG. 3 illustrates a subset of a photovoltaic array that includes six BIP modules in accordance with certain embodiments.

FIG. 3 illustrates a photovoltaic array 300 or more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
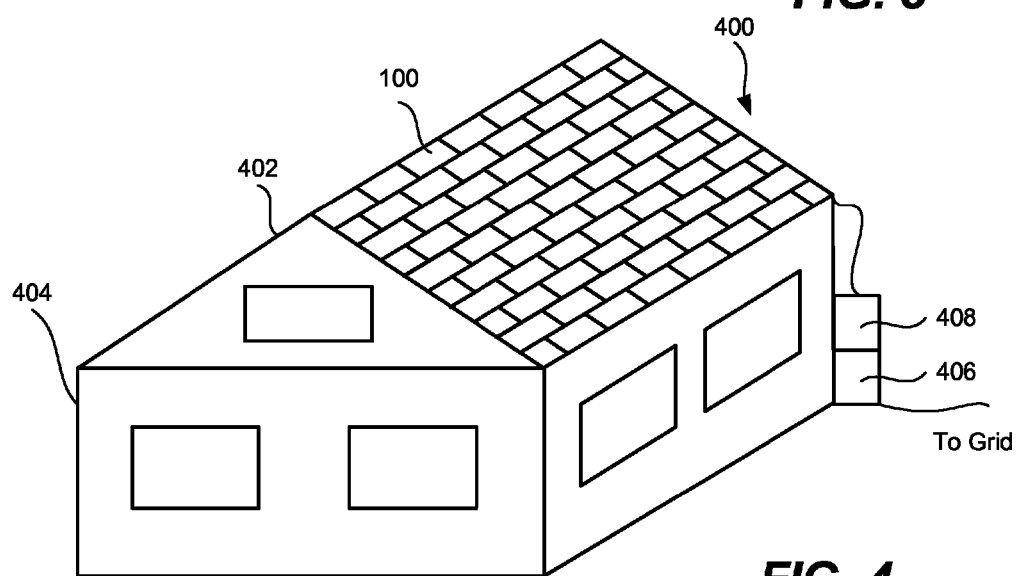
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, (photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240—Gridtec 10, available from Trace Technologies in Livermore, Calif.) and a string inverter (e.g. Sunny Boy®2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
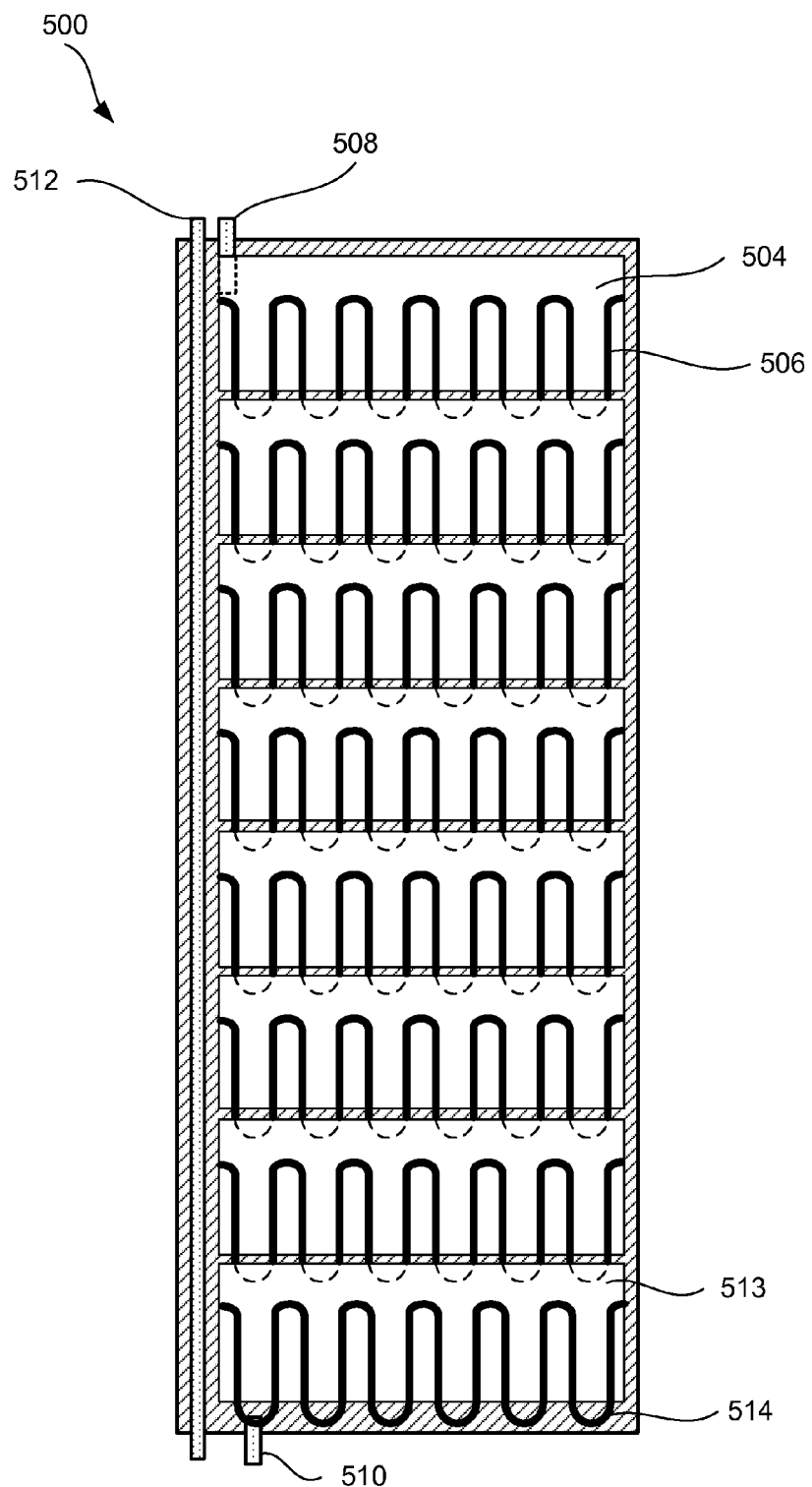
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
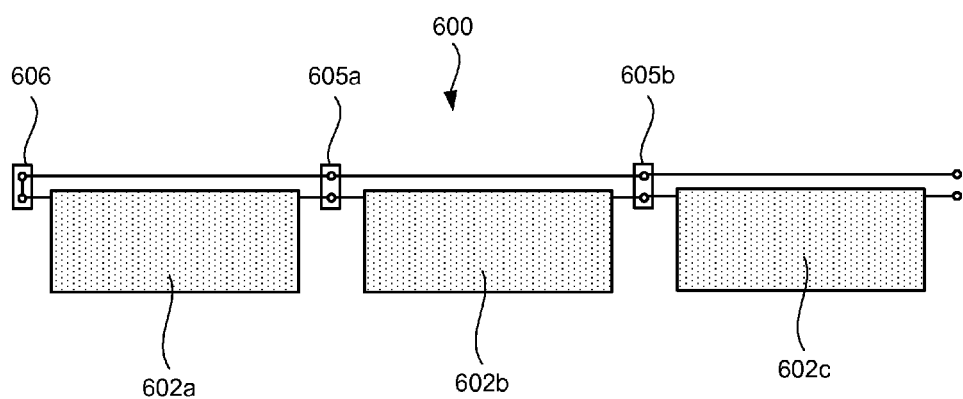
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
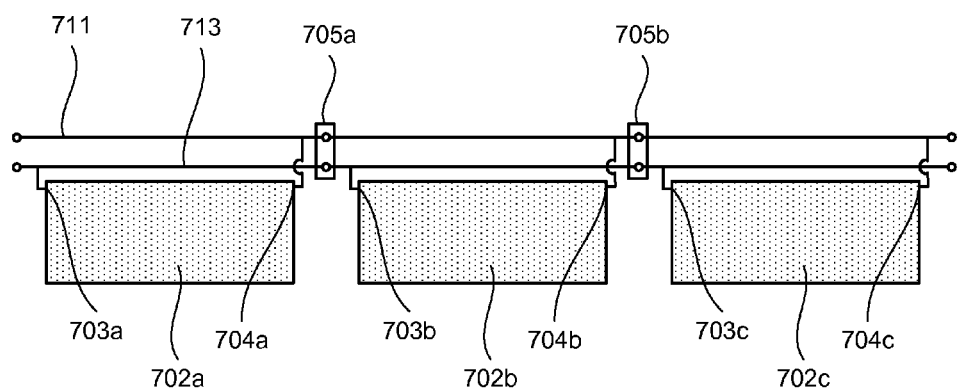
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812*b* are designed to provide more immediate protection to conductive elements 808*a* and 818*a* after connecting the two connectors 800, 815. As such, inner seals 812*a* and 812*b* are positioned near inner cavities of sockets 808*a* and 808*b*. The profile and dimensions of pins 818*a* and 818*b* closely correspond to that of inner seals 812*a* and 812*b*. In the same or other embodiments, connectors 800, 815 have external seals 822*a* and 822*b*. External seals 822*a* and 822*b* may be used in addition to or instead of inner seals 812*a* and 812*b*. Various examples of seal materials and fabrication methods are described below in the context of FIG. 9. FIG. 8C is schematic front view of female connector 800 and male connector 815, in accordance with certain embodiments. Connector pins 818*a* and 818*b* are shown to have round profiles. However, other profiles (e.g., square, rectangular) may also be used for pins 818*a* and 818*b* and conductive element cavities 808*a* and 808*b*.

Figure 9:
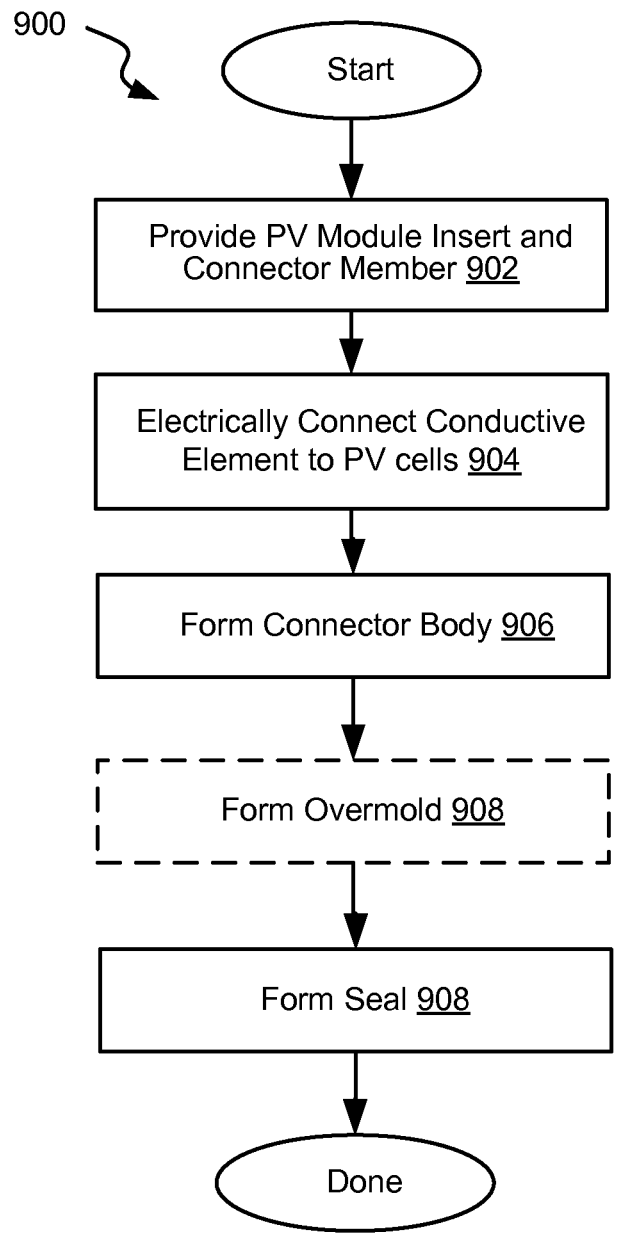
FIG. 9 is a process flowchart corresponding to a method of fabricating a BIP module in accordance with certain embodiments.

Having described some aspects of BIP modules and, more specifically, some aspects of electrical connectors attached to photovoltaic inserts, this document will now describe various examples of a process for fabricating BIP modules. Generally, the process involves electrically connecting conductive elements of the connector member and bus wires of the insert and forming a connector body around at least a portion of the connector member and insert. FIG. 9 is a process flowchart corresponding to a process 900 for fabricating BIP modules in accordance with certain embodiments. Process 900 may start with providing a photovoltaic module insert and a connector member in operation 902. Various examples of photovoltaic module inserts are described above, for example, in the context of FIGS. 1 and 5. In general, an insert includes one or more electrically interconnected photovoltaic cells and two or more bus bars extending away from at least one side of the insert. At least two of these bus bars are electrically connected to the photovoltaic cells.

The connector member provided in operation 902 includes at least one conductive element. In certain embodiments, a connector member includes two or more conductive elements. The connector member may be provided with or without a prefabricated insulating housing. An insulating housing is typically made from one or more temperature resistant materials. Some examples of rigid materials with suitable thermal characteristics are provided above. In specific embodiments, an insulating housing is made from a temperature resistant material having an RTI of at least about 115° C. or, more particularly, having a RTI of at least about 125° C. In certain embodiments, an insulating housing has one or more extension flaps configured to cover and insulate a portion one or more bus bars extending out of the insert and connected to conductive elements positioned within the insulating housing. These extension flaps may be sufficiently flexible to allow accessing to the conductive elements in order to establish electrical connections between the bus bars and conductive elements.

Process 900 may proceed with establishing one or more electrical connections between one or more conductive elements of the connector member and one or more bus bars extending from the inserts (block 904). The electrical connections may be established by resistance welding, ultrasonic welding, laser welding, soldering, crimping, applying conductive adhesive, or any other suitable connection technique. In certain embodiments, a photovoltaic insert is aligned with respect to a connector member prior or during operation 904. This alignment may be maintained during subsequent operations (e.g., operations 906 and/or 908 further described below) or more generally until the connector is rigidly or semi-rigidly attached to the insert. An alignment fixture may be used for this purpose. FIG. 11 illustrates a schematic illustration of an alignment fixture 1108 in accordance with certain embodiments. Alignment fixture 1108 is shown at three stages of BIP module fabrication process 900: during establishing an initial alignment (1110), during formation of a connector body (1120), and after removal of the alignment fixture (1130).

Alignment fixture 1108 may have a reference surface 1108*a* for positioning a photovoltaic insert 1102 and a reference fixture 1108*b* for positioning a conductive element 1106. As shown during stage 1110, a portion of conductive element 1106 and a portion of bus bar 1104 may overlap in an overlap area 1112. At this stage 1110, photovoltaic insert 1102 is considered to be aligned with respect to conductive element 1106. Conductive element 1106 and bus bar 1104 may be mechanically and/or electrically interconnected with each other in overlap area 1112 using one or more attachment techniques described above.

Once the connection between conductive element 1106 and bus bar 1104 is formed, a connector body 1122 may be formed around conductive element 1106 as shown in the next stage 1120. A portion 1124 of connector body 1122 may extend over the connection area 1112 and, in certain embodiments, may extend over at least a portion of photovoltaic insert 1102. This in turn may result in connector body 1122 being rigidly or semi-rigidly attached to insert 1102. In this case, this extended portion 1124 now provides sufficient alignment between the two components. Alignment fixture 1108 may be removed at this point as shown during stage 1130.

Process 900 may proceed with forming a connector body in operation 906. In certain embodiments, a connector body or some parts of it comes in direct contact with electrical components of the BIP module (e.g., conductive elements of the connector member or bus bars extending outside of the insert). In these embodiments, a connector body may be formed using one or more temperature resistant materials. Some examples of rigid materials with suitable thermal characteristics are provided above. In specific embodiments, a temperature resistant material has an RTI of at least about 15° C. or, more particularly, an RTI of at least about 125° C. or even at RTI of at least about 135° C. The temperature resistant material may include one or more of the following additives: mineral fillers, glass fillers, and flame retardants.

In other embodiments, a connector body formed in operation 906 does not directly contact electrical components of the BIP module and temperature resistant materials may not be needed to form the connector body. For example, a connector member provided in operation 902 may include an insulating housing that encloses all electrical components extending outside of the photovoltaic insert (e.g., enclosing its own conductive elements and providing extensions tabs for bus wires extending outside of the insert). In these embodiments, a connector body may be made from polyethylene, polypropylene, thermoplastic rubber, thermoplastic elastomer, and ethylene propylene diene monomer. A connector body is typically formed using injection molding or other suitable techniques.

In certain embodiments, a connector body formed in operation 902 may be insufficient to provide electrical insulation and/or mechanical support. In such situations, process 900 involves operation 908 during which an overmold is formed over a portion of the connector body and, in certain embodiments, a portion of the insert. Operation 908 is optional because a connector body may be sufficient for the above recited purposed without a separate overmold. It should be noted that regardless of an overmold, a connector body may include a temperature resistant materials (e.g., provided as a part of prefabricated insulating housing and/or deposited during operation 904) and, in certain embodiments, other material (e.g., deposited during operation 904 and/or deposited during operation 906). Three specific examples are described below in the context of FIGS. 10A-10C.

Forming overmold in operation 908 may involve injection molding or any other technique. Examples of materials that can be used for an overmold include polyethylene, polypropylene, thermoplastic rubber, thermoplastic elastomer, ethylene propylene diene monomer (EPDM), various fluoroelastomers or thermoplastic vulcanizates (TPV), and flexible cast thermoset materials such as urethanes. In general, flexible thermoplastic elastomers that have suitable thermally durable behavior may be used. Some examples are provided above. An overmold generally extends over at least a portion of the photovoltaic module insert and a portion of the connector body.

Process 900 may continue with forming one or more seals around various cavities' openings in a connector body in operation 908. Various seal examples are described above in the context of FIGS. 8A-8C. Seals may be formed by injection molding or other suitable techniques. In certain embodiments, a seal may be fabricated in a separate process and inserted into the connector body during operation 908. For example, a seal may be an O-ring or more specifically a butyl rubber O-ring or flat ring.

Electrical Connector Examples

Figure 10A:
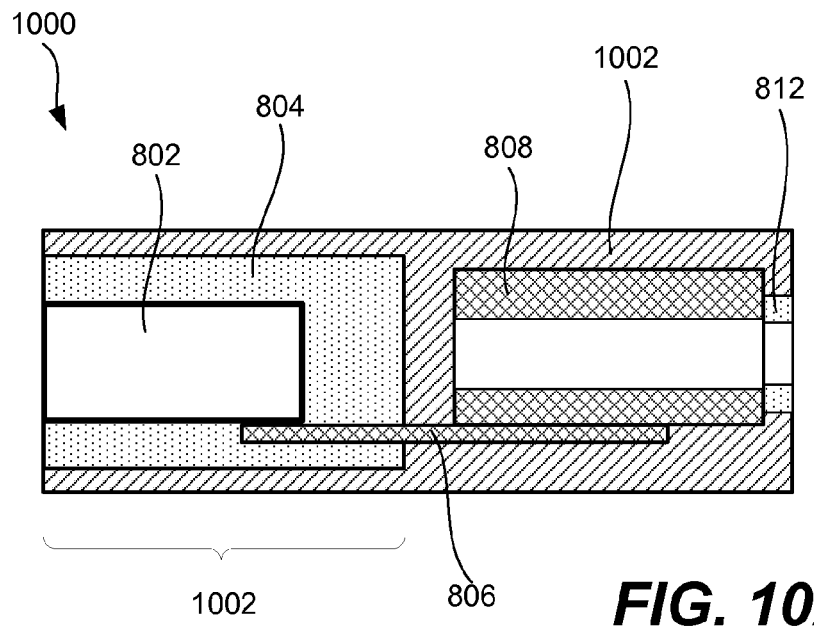
FIG. 10A is a schematic representation of one example a BIP module having a connector made entirely from a temperature resistant material in accordance with certain embodiments.

FIG. 10A is a schematic representation of one example of a BIP module 1000 in accordance with certain embodiments. Some components of this assembly are similar to an assembly described above in the context of FIG. 8A. Specifically, BIP module 1000 includes one or more photovoltaic cells 802 sealed by one or more sealing sheets 804. BIP module 1000 also includes one or more bus bars 806 extending outside of sealing sheets 804 and making an electrical connection with connector element 808. The connector also has a connector body 1002 that electrically insulates and mechanically supports conductive element 808 with respect to sealing sheets 804 or more generally, an entire insert 1002. Since connector body 1002 is in direct contact with conductive element 808 and bus bar 806, it is made from one or more temperature resistant materials, such as a RTI rated materials listed above. BIP module 1000 also includes a seal 812 positioned around the opening of connector body for protecting connector element 808 from contaminants after establishing a connection with another connector. As shown in FIG. 10A, there is no additional overmold positioned around connector body 1002. Connector body 1002 provides sufficient mechanical support and electrical insulation in this example.

However, making a complete connector out of RTI rated materials may be prohibitively expensive and/or may not provide certain characteristics, such as UV stability, mechanical support, and electrical insulation. In certain embodiments, a connector may include an inner component made from one or more temperature resistant materials, such as RTI rated materials, and an outer portion made from some other materials. The inner portion contacts electrical components of the module (e.g., bus bars and conductive elements) and may be configured to fully enclose these components and prevent any contacts with an outer portion of the connector made from other materials. The inner portion may come as a prefabricated insulating housing (e.g., with flap extensions) or formed completely or partially during one or more injection molding operations during the overall BIP module fabrication process described above. For example, a prefabricated insulating housing may only cover some electrical components (e.g., conductive elements of the connector), while other (e.g., bus bars) may extend outside of the housing. A separate operation may be used to apply one or more temperature resistant materials around the remaining exposed electrical components before forming the remainder of the connector body from other non-temperature resistant materials.

Figure 10B:
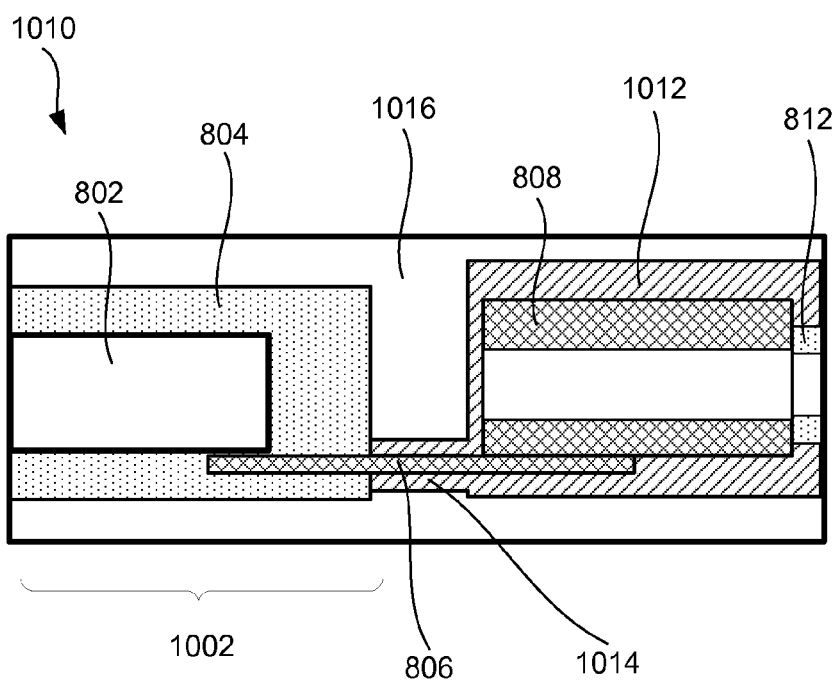
FIG. 10B is a schematic representation of another example of a BIP module having a connector made from a prefabricated insulating housing and an overmold formed around the housing in accordance with certain embodiments.

FIG. 10B is a schematic representation of another example of a BIP module 1010 having a connector made from a prefabricated insulating housing 1012 and an overmold 1016 formed around housing 1012 in accordance with certain embodiments. Insulating housing 1012 is shown with extension flaps 1014 that insulate a portion of bus bar 806 extending from sealing sheets 804. Insulating housing 1012 may be partially or fully covered with overmold 1016. Overmold 1016 also extends over at least a portion of the insert 1002.

Figure 10C:
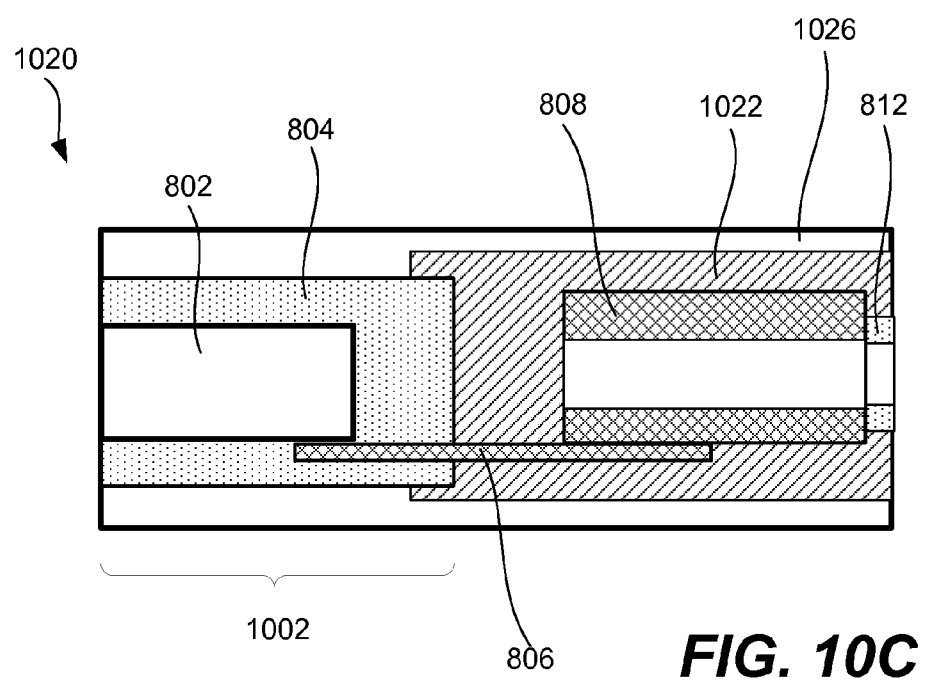
FIG. 10C is a schematic representation of yet another example of a BIP module having an inner portion of the connector made from a temperature resistant material and an outer portion of the connector made from a different material in accordance with certain embodiments.
Figure 12:
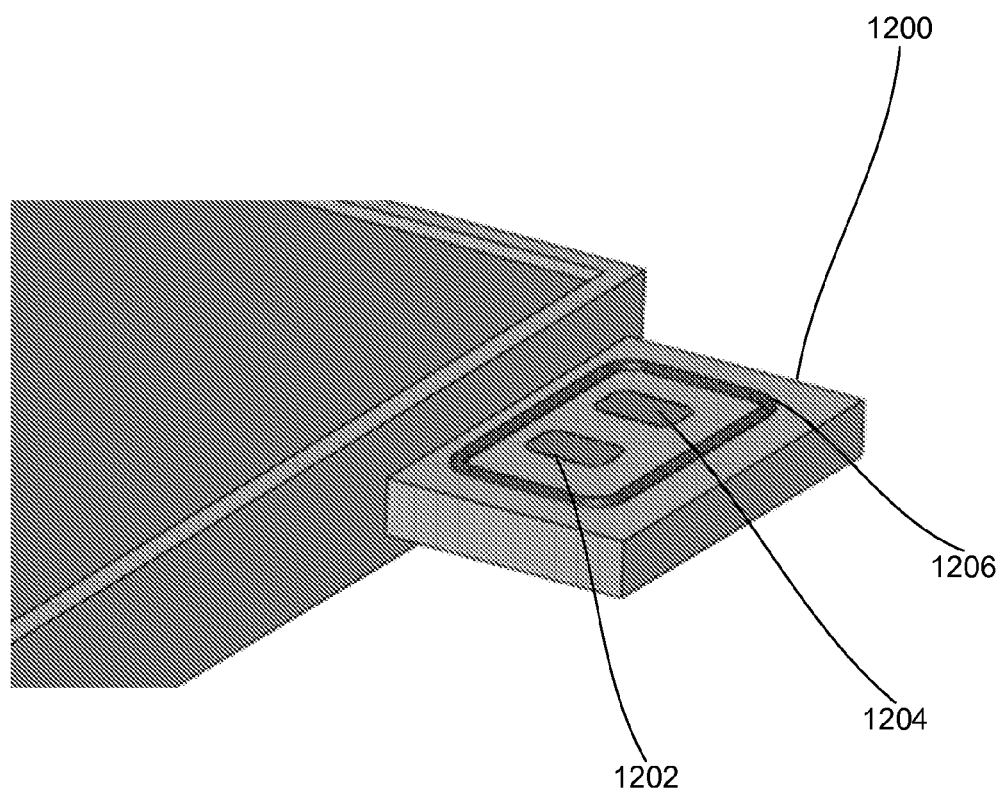
FIG. 12 is a schematic illustration of a connector member having two flat conductive elements in accordance with certain embodiments.

FIG. 10C is a schematic representation of yet another example of a BIP module 1020 having an inner portion 1022 of the connector made from a temperature resistant material and an outer portion 1026 of the connector made from a different material in accordance with certain embodiments. Inner portion 1022 may be configured to insulate both conductive element 808 and bus bar 806. In certain embodiments, inner portion 1022 may cover a portion of the photovoltaic insert 1002 as, for example, shown in FIG. 10C. Inner portion 1022 is made from one or more temperature resistant materials described above. Outer portion 1026 is made from other generally less expensive materials that have different functional characteristics (e.g., high UV stability.)

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A photovoltaic module comprising:
  a front sealing sheet;
  a back sealing sheet;
  a plurality of electrically interconnected photovoltaic cells sealed between the front sealing sheet and the back sealing sheet;
  a first conductive element electrically connected to the photovoltaic cells and extending in a first direction outside a first edge of the front sealing sheet;
  a first electrical connector element electrically connected to the first conductive element and positioned outside the front sealing sheet and back sealing sheet; and
  an electrical connector including:
    an inner body portion that is a mold that comprises a temperature resistant material having a Relative Temperature Index (RTI) of at least about 115° C., and that extends around and electrically insulates the electrical connection between the first conductive element and the first electrical connector element, and an outer body portion that extends around the inner body portion, extends over a first portion of the front sealing sheet and a second portion of the back sealing sheet, and extends over a portion of the first electrical connector element.

2. The photovoltaic module of claim 1, further comprising:
a second conductive element electrically connected to the photovoltaic cells and extending in the first direction outside the first edge of the front sealing sheet; and
a second electrical connector element electrically connected to the second conductive element and positioned outside the front sealing sheet and back sealing sheet, wherein the inner body portion extends around and electrically insulates the electrical connection between the second conductive element and the second electrical connector element.

3. The photovoltaic module of claim 2, wherein the first electrical connector element and the second electrical connector element extend away from the inner body portion in a direction parallel to the first direction.

4. The photovoltaic module of claim 1, wherein the inner body portion further comprises one or more materials selected from the group consisting of: polyethylene, polypropylene, thermoplastic rubber, thermoplastic elastomer, and ethylene propylene diene monomer.

5. The photovoltaic module of claim 1, wherein outer body portion comprises one or more materials selected from the group consisting of: polyethylene, polypropylene, thermoplastic rubber, thermoplastic elastomer, ethylene propylene diene monomer, fluoroelastomers, thermoplastic vulcanizates, and flexible cast thermoset materials.

6. The photovoltaic module of claim 1, wherein the inner body portion is offset from front sealing sheet and from the back sealing sheet.

7. The photovoltaic module of claim 1, wherein the temperature resistant material has a Relative Temperature Index (RTI) of at least about 125° C.

8. The photovoltaic module of claim 1, wherein the outer body portion and the inner body portion are made from different materials.

* * * * *